United States Patent
Takeuchi et al.

(10) Patent No.: US 7,687,314 B2
(45) Date of Patent: Mar. 30, 2010

(54) ELECTRONIC APPARATUS MANUFACTURING METHOD

(75) Inventors: Shuichi Takeuchi, Kawasaki (JP); Hidehiko Kira, Kawasaki (JP); Kenji Kobae, Kawasaki (JP); Yoshiyuki Satoh, Kawasaki (JP); Tetsuya Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/330,302

(22) Filed: Dec. 8, 2008

(65) Prior Publication Data
US 2009/0170245 A1 Jul. 2, 2009

(30) Foreign Application Priority Data
Dec. 28, 2007 (JP) ............................. 2007-338797

(51) Int. Cl.
H01L 21/50 (2006.01)
(52) U.S. Cl. ................. 438/108; 438/118; 257/E21.499
(58) Field of Classification Search ................. 438/108, 438/118
See application file for complete search history.

(56) References Cited

U.S. PATENT DOCUMENTS

| | | | | |
|---|---|---|---|---|
| 7,449,406 | B2* | 11/2008 | Nishiyama et al. | 438/612 |
| 2001/0016372 | A1* | 8/2001 | Murakami | 438/113 |
| 2004/0040740 | A1* | 3/2004 | Nakatani et al. | 174/256 |
| 2006/0292753 | A1* | 12/2006 | Takahashi et al. | 438/127 |
| 2007/0020912 | A1* | 1/2007 | Nishiyama et al. | 438/613 |
| 2008/0254610 | A1* | 10/2008 | Suga et al. | 438/612 |

FOREIGN PATENT DOCUMENTS

| | | |
|---|---|---|
| JP | 2004-039886 | 2/2004 |
| JP | 2004-311709 | 11/2004 |
| JP | 2008-084951 | 4/2008 |

* cited by examiner

*Primary Examiner*—Alexander G Ghyka
(74) *Attorney, Agent, or Firm*—Staas & Halsey LLP

(57) ABSTRACT

An electronic apparatus manufacturing method comprises applying a first adhesive agent to a mounting portion, a first heating, in such a way that connection pads and bumps, come into contact, by pressing a heating head against a non-mounting surface of the electronic component, heating the electronic component, hardening the first adhesive agent, affixing the mounting substrate and electronic component, filling a space between the mounting substrate and the electronic component with a second adhesive agent under reduced pressure, and a second heating step of, from being under reduced pressure to being under atmospheric pressure, by pressing the heating head against the non-mounting surface of the electronic component, heating the electronic component, as well as hardening the second adhesive agent, melting the connection pads, and joining the connection pads and the bumps.

7 Claims, 14 Drawing Sheets

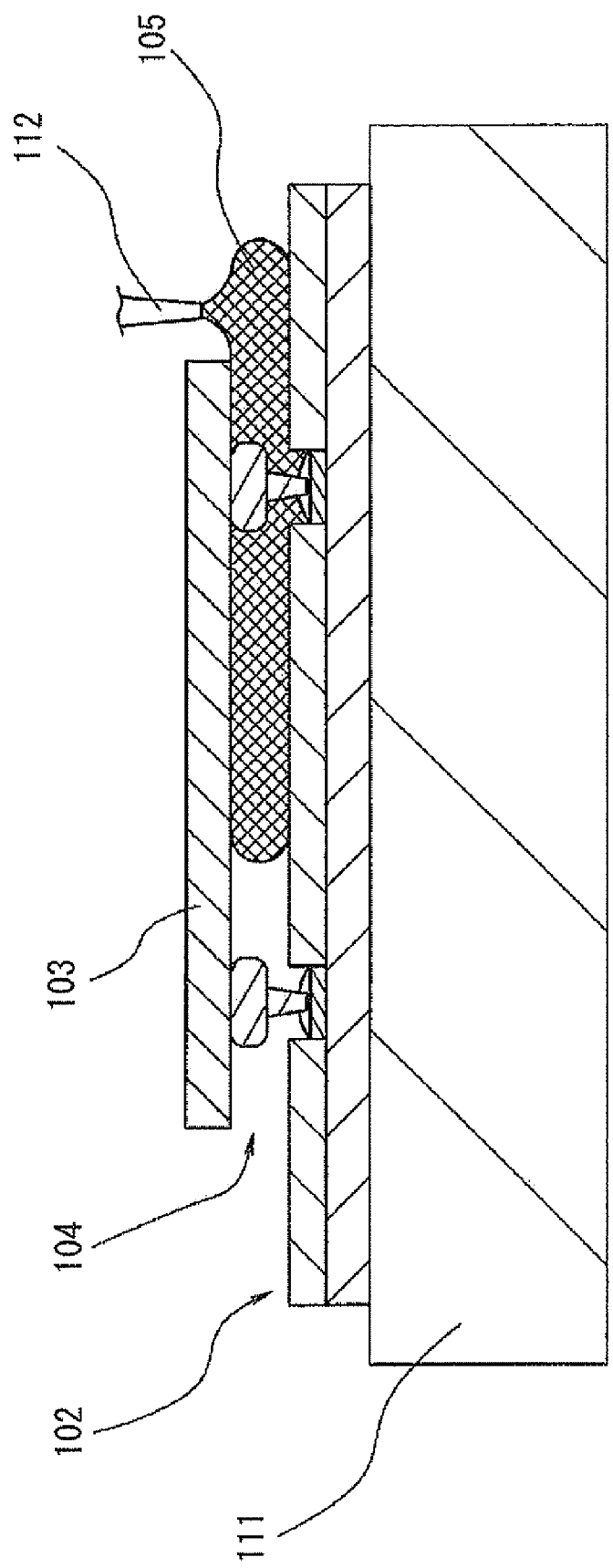

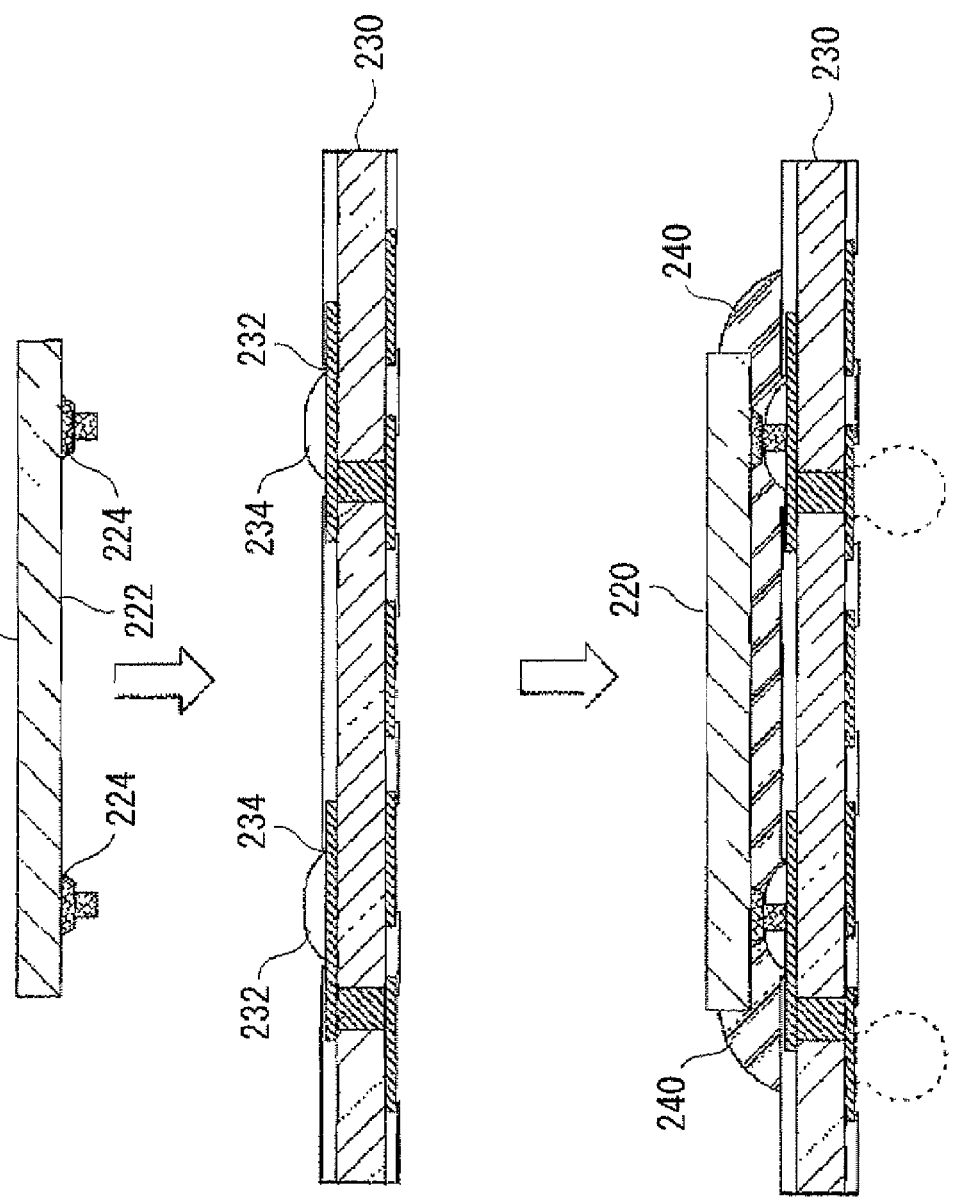

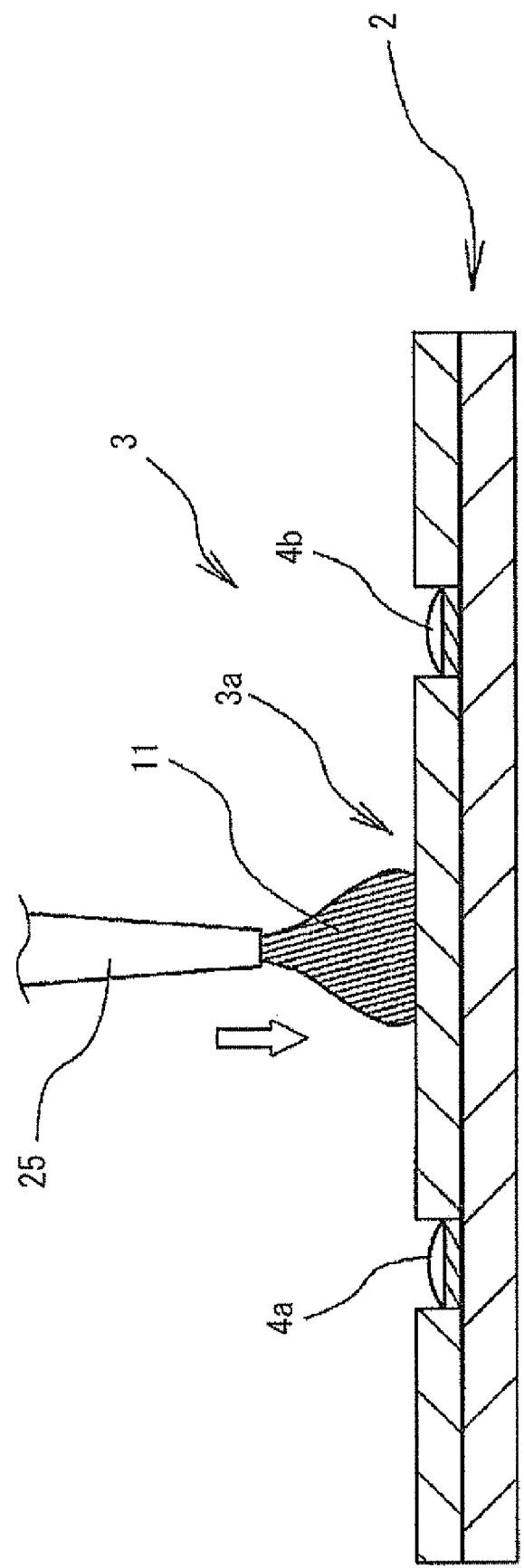

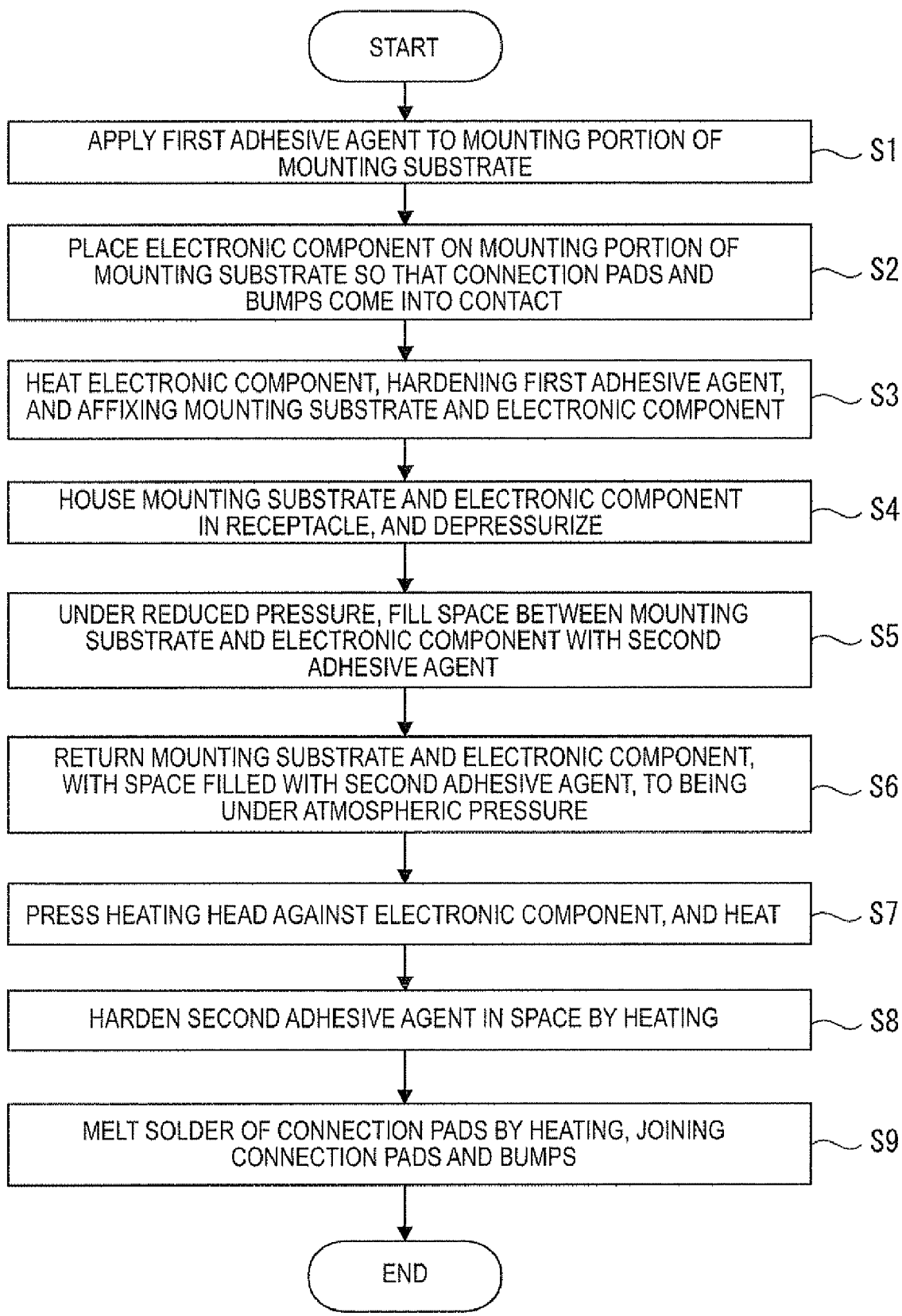

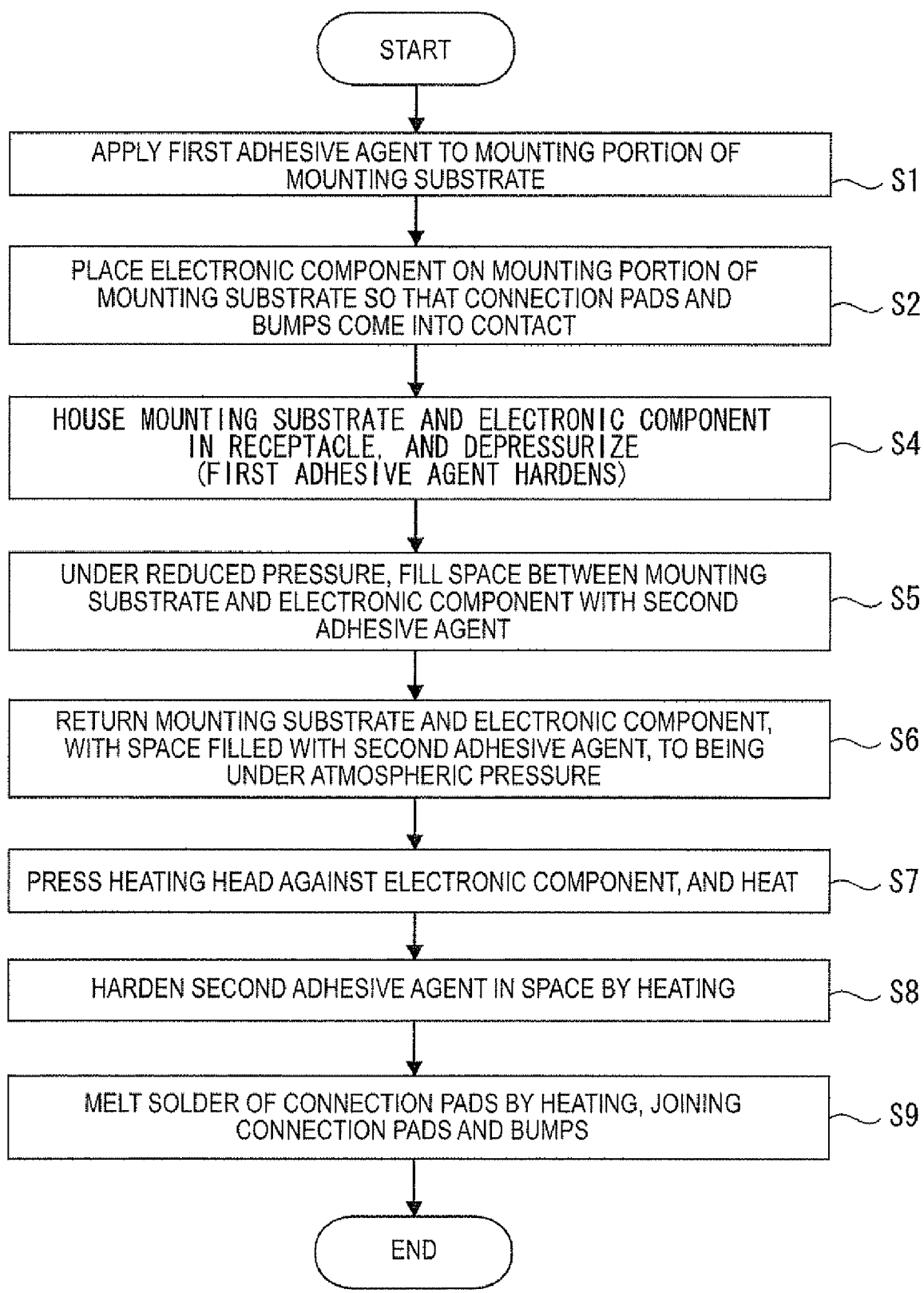

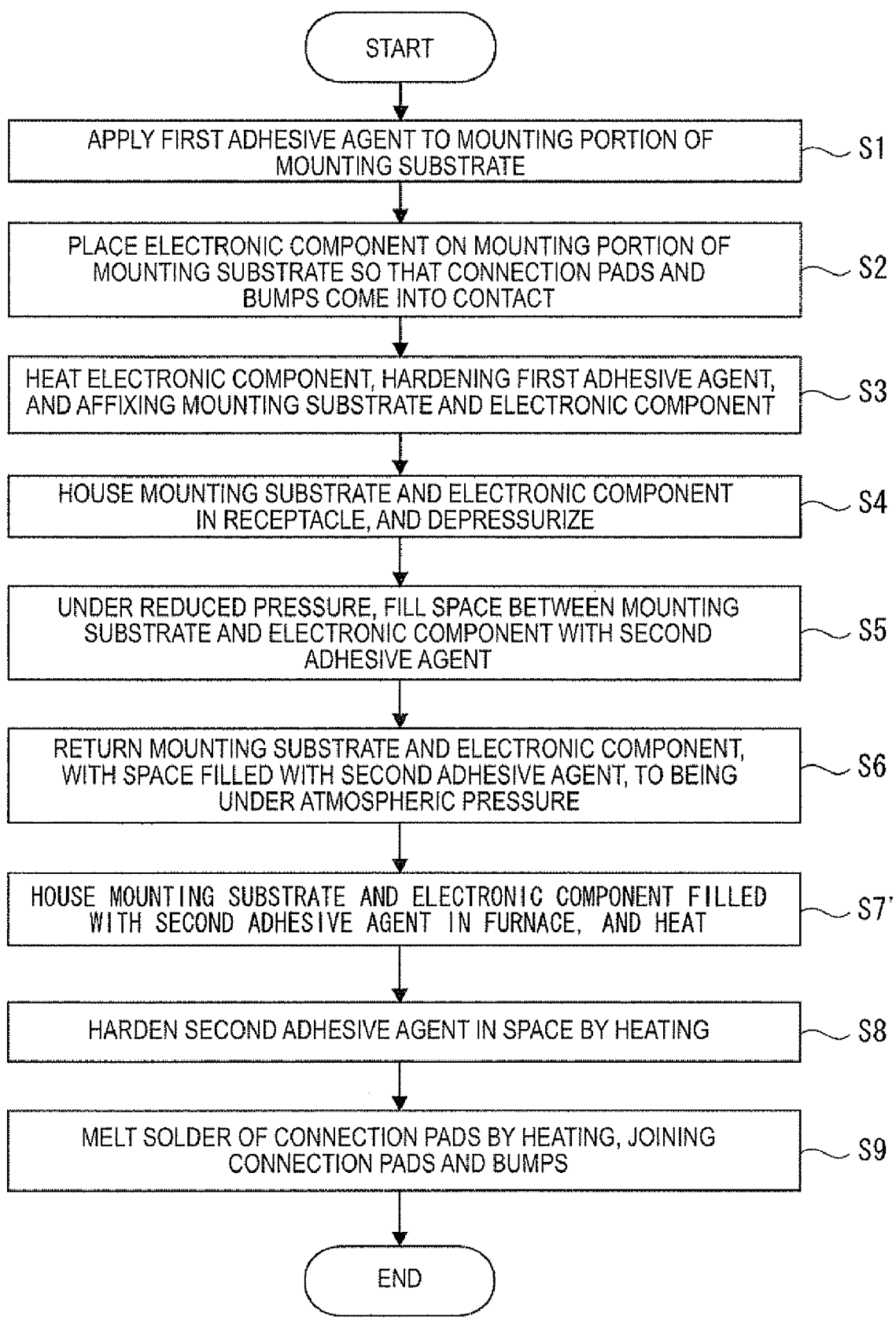

ELECTRONIC APPARATUS MANUFACTURING METHOD

CROSS-REFERENCE TO RELATED APPLICATIONS

This application is based upon and claims the benefit of priority of the prior Japanese Patent Application No. 2007-338797, filed on Dec. 28, 2007, the entire contents of which are incorporated herein by reference.

BACKGROUND

1. Field

The present technology relates to an electronic apparatus manufacturing method with which a space between a mounting substrate and an electronic component mounted on the mounting substrate is filled with an adhesive agent.

2. Description of the Related Art

As an example of an electronic apparatus in which a space between a mounting substrate and an electronic component mounted on the mounting substrate is filled with an adhesive agent, a semiconductor apparatus, in which a semiconductor chip is flip-chip connected to a wiring substrate for a mounting, is proposed.

To date, in the case of filling the space of this kind of electronic apparatus with an adhesive agent, a method has been known with which, as shown in FIG. 1, an adhesive agent 105 is supplied from a nozzle 112 to a vicinity of a space 104 between a mounting substrate 102 and an electronic component 103, while heating the mounting substrate 102 on a hot plate 111, filling the space 104 by means of a so-called capillary action.

However, in an electronic apparatus in which the space is filled by the adhesive agent with the heretofore described method, a problem has arisen in that, due to a reduction in an adhesive property caused by an appearance of a portion unfilled by the adhesive agent, a reliability of the apparatus is reduced. More specifically, in the event that a void (an air bubble enclosed in the adhesive agent at a time of filling) exists between stud bumps or wirings, it may happen that a problem arises wherein a short circuit with a neighboring wiring occurs due to a migration so, particularly under a condition wherein a wiring pitch in recent years has become minute, further measures against inter-wiring voids are important.

Herein, as a heretofore known electronic apparatus manufacturing method which can control an appearance of a void at a time of filling with an adhesive agent, the manufacturing method illustrated by FIG. 2 has been proposed (Japanese Laid-open Patent Publication No. 2007-103772). This method, including a configuration which has a step of joining a plurality of electrodes 224, formed in a two-dimensional form on one main surface 222 of a semiconductor chip 220, to corresponding conductive areas 232 and 234 on a substrate 230, a step of, in a vacuum atmosphere, supplying an adhesive agent (an underfill resin) 240 to a space between the one main surface of the semiconductor chip and the substrate, and a step of exposing the semiconductor chip and substrate, to which the adhesive agent 240 has been supplied, to the atmosphere, controls an appearance of a void in the adhesive agent, and enables a manufacture of a semiconductor apparatus which realizes a highly reliable flip-chip mounting. This manufacturing method is referred to as a so-called "adhesive agent in last method".

Meanwhile, there is an electronic apparatus manufacturing method referred to as a so-called "adhesive agent in first method". With this method, as shown in FIGS. 3A to 3C, firstly, a necessary amount of an adhesive agent 311 is applied with a nozzle 325 onto a mounting substrate 302 (refer to FIG. 3A), after which, an electronic component 305 is placed in a mounting position, with its mounting surface 305a opposing the mounting substrate 302. Subsequently, a heating head 324 is pressed against a non-mounting surface 305b of the electronic component 305, and the electronic component 305 is heated with the heating head 324.

The adhesive agent 311 sandwiched between the mounting substrate 302 and the electronic component 305 is caused to be pushed outward by a suppressing strength of the heating head 324, filling a space 308 (refer to FIG. 3B). Also, connection pads 304 of the mounting substrate 302, and bumps 306 of the electronic component 305, come into contact.

Furthermore, the method is such that, by the connection pads 304 of the mounting substrate 302 being heated through the electronic component 305, as well as a solder of the connection pads 304 melting, and the connection pads 304 and bumps 306, which are in a contact condition, being joined, the adhesive agent 311 filling the space 308 also hardens due to the heating (refer to FIG. 3C), and the electronic apparatus is manufactured.

Herein, in the case of employing the "adhesive agent in last method", a problem may arise wherein, after the electronic component is joined to the mounting substrate, at a time of transporting the electronic apparatus, such as, for example, carrying in into a depressurization receptacle, the joint portion is more liable to break than with the "adhesive agent in first method", due to a protection of a joint portion being insufficient because of not being filled with the adhesive agent, or the like.

Meanwhile, in the case of employing the "adhesive agent in first method", a problem may arise wherein an unfilled portion in the adhesive agent filling the space between the mounting substrate and the electronic component is more likely to occur than with the "adhesive agent in last method". In particular, the problem is notably likely to occur in a case of a so-called microscopic form, in which an interval between bumps is narrow.

SUMMARY

According to an aspect of an embodiment, a method of manufacturing an electronic apparatus is provided by applying a first adhesive agent to a mounting portion provided on a mounting substrate. After placing an electronic component on the mounting portion, with a mounting surface of the electronic component opposing the mounting portion in such a way that connection pads provided in the mounting portion come into contact with bumps provided on the electronic component, depending upon a type of the first adhesive agent, the electronic component is affixed to the mounting substrate by the first adhesive agent, or the electronic component is heated to affix the electronic component to the mounting substrate. A space between the mounting substrate and the electronic component affixed to the mounting substrate is filled with a second adhesive agent under reduced pressure. The electronic component affixed to the mounting substrate and with the filled space, is returned from the reduced pressure to atmospheric pressure. The connection pads are melted to join the connection pads and the bumps to form the electronic apparatus.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a schematic view for illustrating an example of an electronic apparatus manufacturing method according to a heretofore known embodiment;

FIG. 2 is a schematic view for illustrating an example of an electronic apparatus manufacturing method according to a heretofore known embodiment;

FIG. 4 is a schematic view for illustrating an example of an electronic apparatus manufacturing method according to an embodiment;

FIG. 12 is a flowchart showing a procedure of the electronic apparatus manufacturing method according to the embodiment;

FIG. 13 is a flowchart showing a procedure of an electronic apparatus manufacturing method according to a second embodiment; and FIG. 14 is a flowchart showing a procedure of an electronic apparatus manufacturing method according to a third embodiment.

DETAILED DESCRIPTION OF THE PREFERRED EMBODIMENTS

Figure 3A:
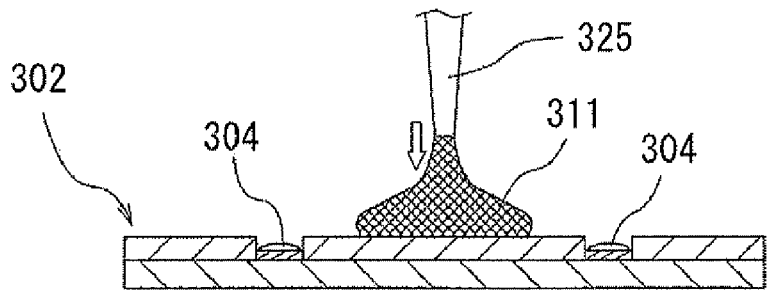
FIGS. 3A to 3C are schematic views for illustrating an example of an electronic apparatus manufacturing method according to a heretofore known embodiment.

Hereafter, referring to the drawings, a detailed description will be given of embodiments. FIGS. 4 to 11 are schematic views for illustrating an example of a manufacturing method of an electronic apparatus according to an embodiment. FIG. 12 is a flowchart showing a procedure of the manufacturing method of the electronic apparatus according to the embodiment. FIG. 13 is a flowchart showing a procedure of a manufacturing method of an electronic apparatus according to a second embodiment. FIG. 14 is a flowchart showing a procedure of a manufacturing method of an electronic apparatus according to a third embodiment. Regarding reference numerals, a reference numeral 4 is used as a collective term for reference numerals 4a, 4b, . . . (the same applies to other reference numerals).

The manufacturing method of the electronic apparatus according to the embodiment is a method whereby an electronic apparatus 10 is manufactured by mounting an electronic component 5 on a mounting substrate 2, and filling a space 8 between the mounting substrate 2 and the electronic component 5 with an adhesive agent. As an example of this kind of mounting and electronic apparatus, a semiconductor apparatus, configured by flip-chip connecting the electronic component 5 (a semiconductor chip) to the mounting substrate 2 (a wiring substrate for a mounting), is proposed. In such a case, a distance between the mounting substrate 2 and the electronic component 5 in the space 8 is, as one example, around 10 to 20 μm.

Herein, in the embodiment, a plurality of bumps 6 are provided on the electronic component 5, each of which is connected to a corresponding connection pad 4 on the mounting substrate 2. As one example, it is a so-called microscopic form in which a height direction dimension of a bump is around 40 μm, and a pitch between adjacent bumps is around 40 μm.

The procedure of the manufacturing method of the electronic apparatus according to the embodiment will be described. FIG. 12 is the flowchart thereof. The electronic apparatus 10, as one example, is an apparatus formed by flip-chip connecting the electronic component 5 (a semiconductor chip) to the mounting substrate 2 (a wiring substrate for a mounting), and filling the space 8 between them with the adhesive agent (refer to FIG. 11).

Figure 5:
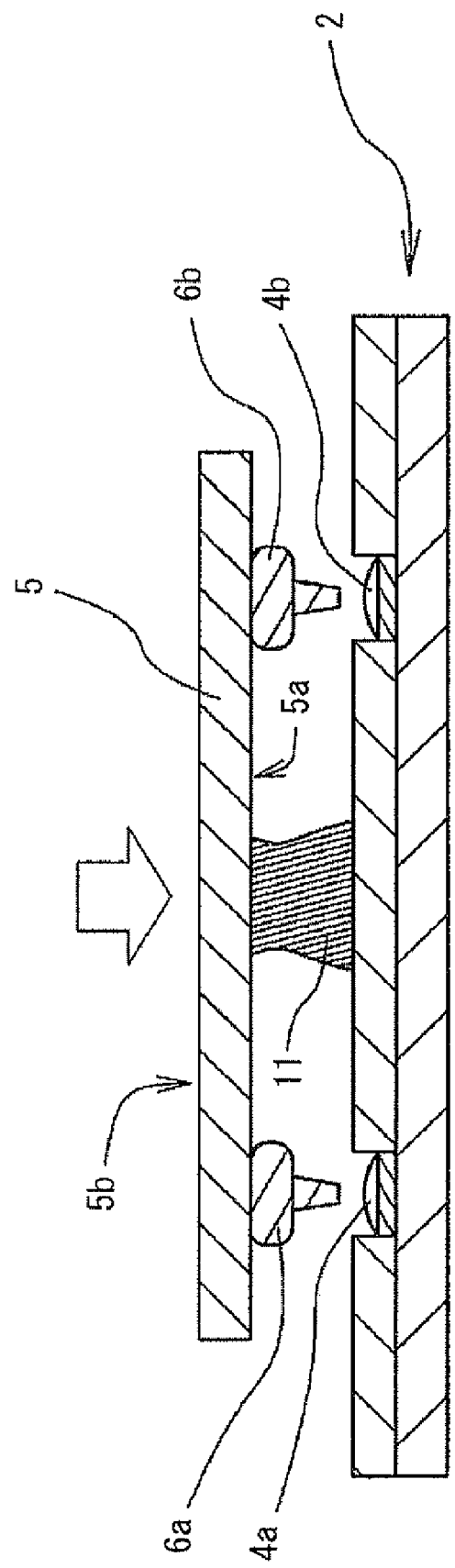
FIG. 5 is a schematic view for illustrating the example of the electronic apparatus manufacturing method according to the embodiment.

As shown in FIGS. 4 and 5, a mounting portion 3, which is a site on which the electronic component 5 is mounted, is provided on the mounting substrate 2. More specifically, the connection pads 4, to which the bumps 6 (to be described hereafter) of the electronic component 5 are joined, are provided in the mounting portion 3. In the embodiment, the connection pads 4 are formed using a solder. In an actual manufacturing, as one example, they are formed as a so-called solder pre-coated substrate.

Meanwhile, the bumps 6 to be connected to the connection pads 4 are provided in the electronic apparatus 5, on a surface (hereafter called a "mounting surface") 5a opposing the mounting substrate 2, corresponding to positions of the connection pads 4 of the mounting portion 3 of the mounting substrate 2. As one example, the bumps 6 are formed using gold (Au).

Firstly, as shown in FIG. 4, an application operations is performed in which a first adhesive agent 11 is applied from a nozzle 25 onto a central position 3a of the mounting portion 3 of the mounting substrate 2 (S1). Herein, as one example, an epoxy based thermosetting resin is used as the first adhesive agent 11.

Also, the central position 3a, rather than indicating a strict central position on the mounting portion 3, refers to a position, and neighboring positions thereof, which is roughly central with respect to the plurality of connection pads 4a, 4b, . . . provided, as shown in FIG. 4.

Next, as shown in FIG. 5, the electronic component 5 is placed on the mounting portion 3, facing the mounting surface 5a, in such a way that the connection pads 4 provided in the mounting portion 3, and the bumps 6 provided on the electronic component 5 to be mounted on the mounting portion 3, come into contact (S2).

Herein, it is preferable to set the amount of the first adhesive agent 11 applied in the application operation in such a way that the first adhesive agent 11 applied to the mounting portion 3 in the application operation does not extend to contact portions of the connection pads 4 and bumps 6 when placing the electronic component 5 on the mounting portion 3 in S2. As a void is likely to appear in the event that the first adhesive agent 11 extends to the contact portions of the connection pads 4 and bumps 6, it is possible to affix the mounting substrate 2 and electronic component 5 while achieving a prevention thereof.

Although an aspect of the application of the first adhesive agent 11 is taken, in the embodiment, to be a single point application, it is also acceptable to make it a multipoint application. Consequently, an application position is not limited to the central position 3a or its vicinity.

Figure 6:
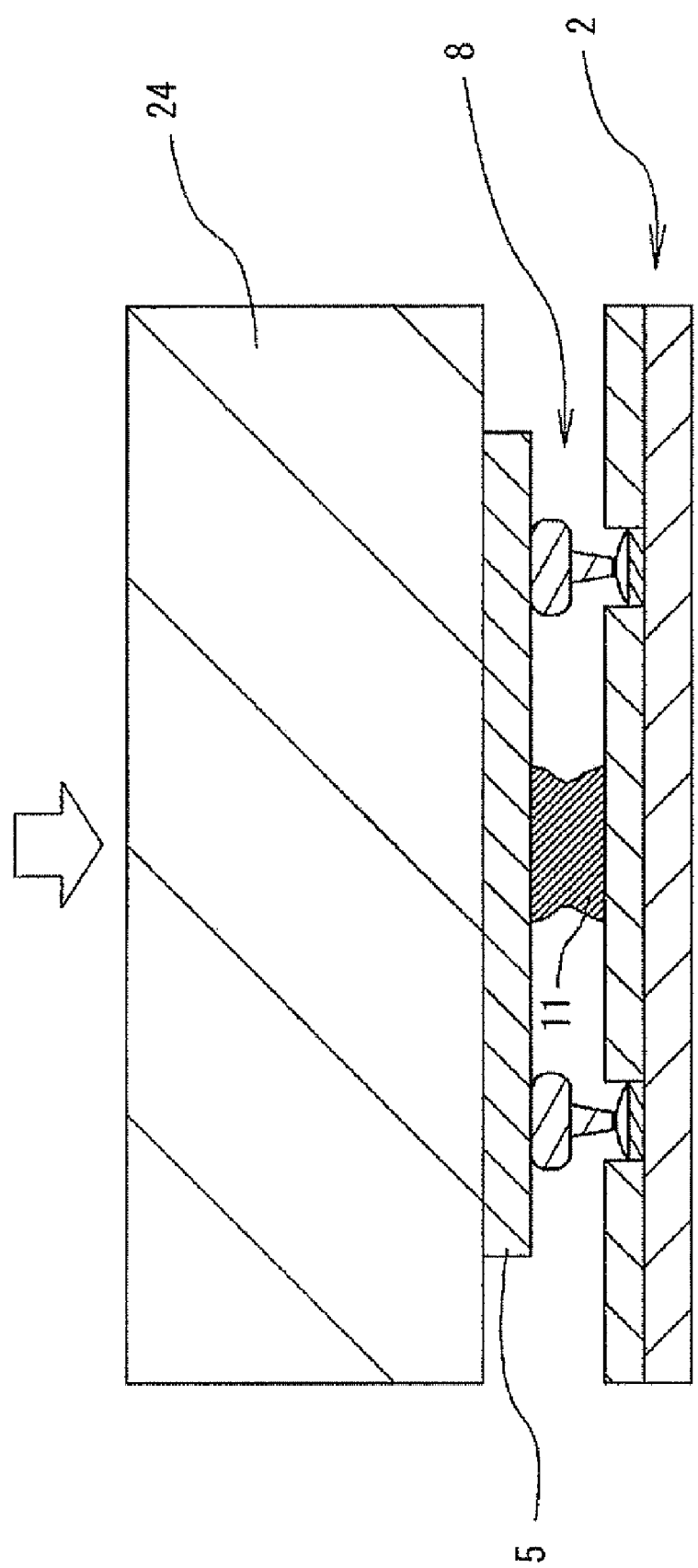
FIG. 6 is a schematic view for illustrating the example of the electronic apparatus manufacturing method according to the embodiment.

Next, as shown in FIG. 6, a first heating is performed in which, by pressing a heating head 24 against a non-mounting surface 5b of the electronic component 5, heating the electronic component 5, the first adhesive agent 11 is hardened, affixing the mounting substrate 2 and electronic component 5 (S3).

Herein, in the first heating, the electronic component 5 is heated at a temperature at which the first adhesive agent 11 hardens, and at a temperature at which the solder of the connection pads 4 does not melt.

That is, a condition being such that the connection pads 4 provided in the mounting portion 3, and the bumps 6 provided on the electronic component 5 to be mounted on the mounting portion 3, remain in contact, and the solder of the connection pads 4 does not melt, the mounting substrate 2 and electronic component 5 are affixed by the first adhesive agent 11, made of a thermosetting resin, being heated and hardening in that condition.

Figure 7:
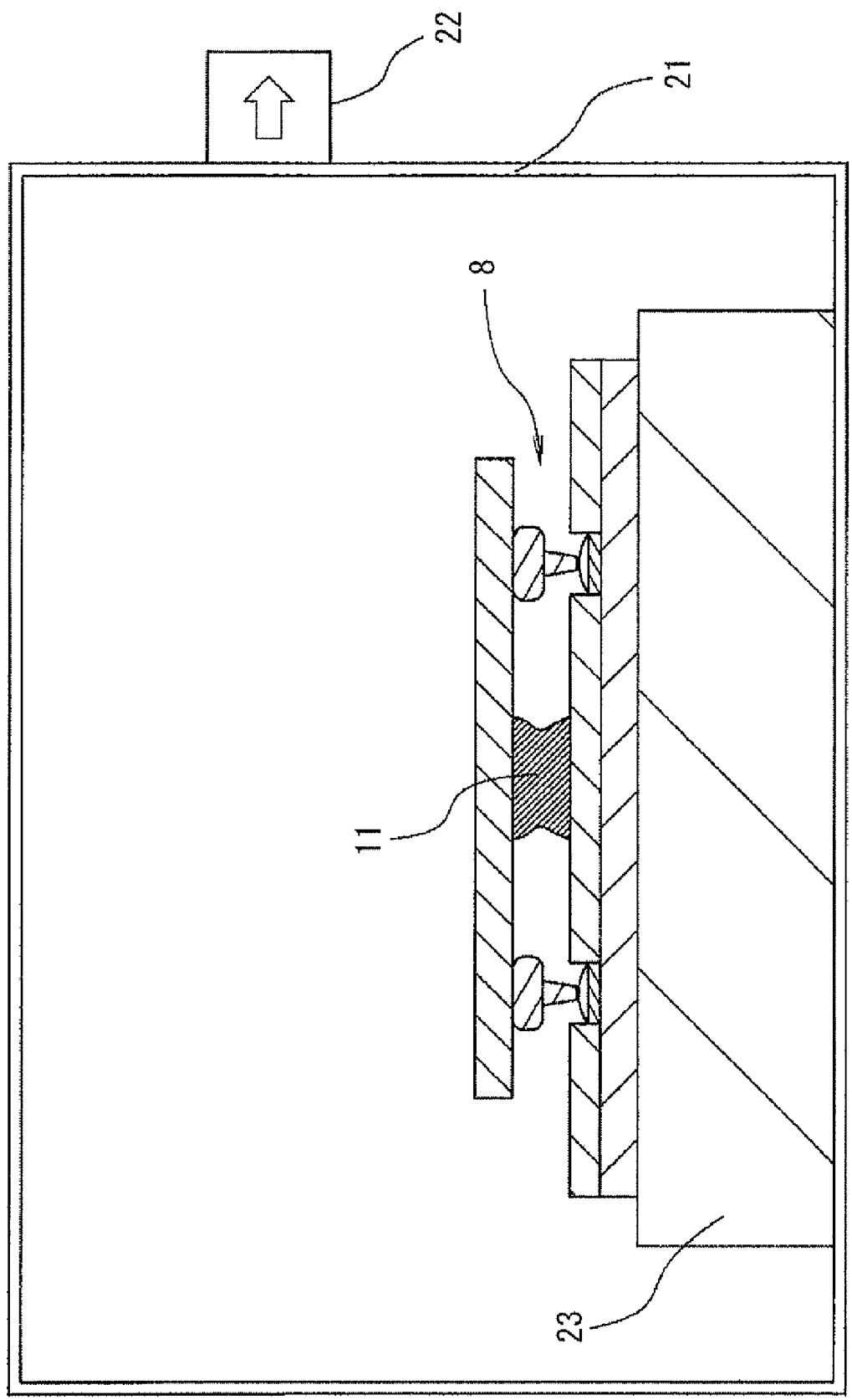
FIG. 7 is a schematic view for illustrating the example of the electronic apparatus manufacturing method according to the embodiment.

Next, as shown in FIG. 7, the mounting substrate 2 and electronic component 5 are housed in a receptacle 21. In this condition, (S4) is performed in which an inside of the receptacle 21 is depressurized using a depressurizing mechanism 22. As a depressurized environment, it is preferable that a pressure inside the receptacle 21 is reduced to 160 Torr (approximately 21.3 kPa) or less. In the embodiment, a depressurized environment of 3 Torr is adopted.

Figure 8:
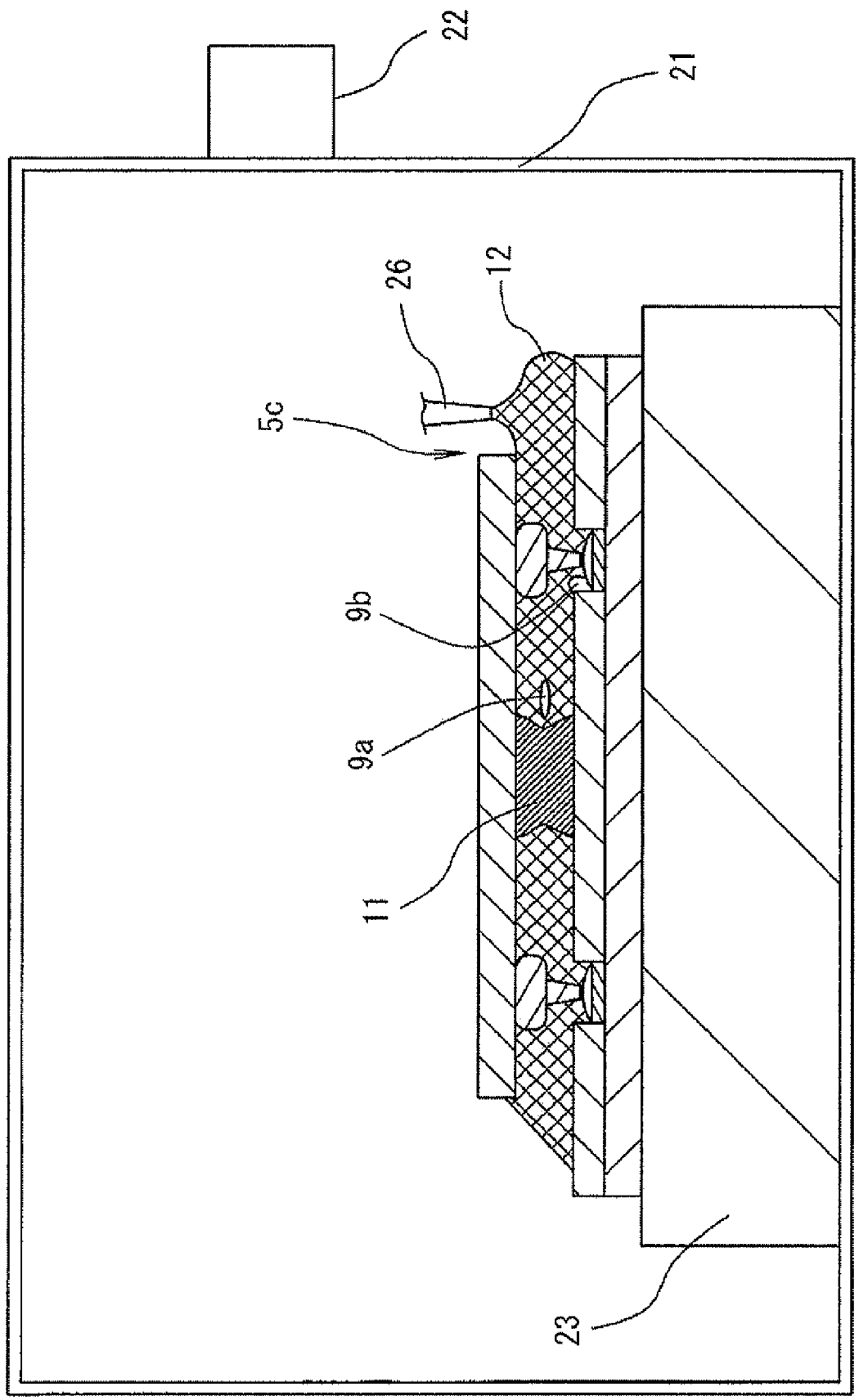
FIG. 8 is a schematic view for illustrating the example of the electronic apparatus manufacturing method according to the embodiment.

Next, as shown in FIG. 8, a filling (S5) is performed in which, by supplying a predetermined amount of a second adhesive agent 12 from a nozzle 26 onto the mounting substrate 2, in a vicinity of a peripheral portion 5c of the electronic component 5 mounted on the mounting substrate 2, the space 8 between the mounting substrate 2 and electronic component 5 is filled with the second adhesive agent 12. It is preferable that the filling of the space 8 with the second adhesive agent 12 is carried out from one side, or two mutually perpendicular sides of the peripheral portion 5c of the electronic component 5, or from any unfilled side of the first adhesive agent 11.

However, when the space 8 is filled with the second adhesive agent 12, it can happen that an unfilled portion (a void) 9 appears.

It should be noted that the heretofore described filling is one which naturally fills the space 8 with the second adhesive agent 12 by means of a so-called capillary action, which occurs due to a gap between the mounting substrate 2 and electronic component 5 being extremely narrow. Consequently, a setting of appropriate filling conditions (a filling amount and a filling time) is carried out in accordance with conditions of a height dimension of the space 8, and a material of the second adhesive agent 12. As one example, an epoxy based thermosetting resin is used as the second adhesive agent 12.

By also heating a temperature regulating stage 23 at this time, the mounting substrate 2 on which the electronic component 5 is mounted is heated to, and maintained at, a predetermined temperature. The temperature regulating stage 23 is configured in such a way that, as well as it being possible to place the mounting substrate 2 on its upper surface, it can be heated at a predetermined temperature. As one example, a method of heating using a built-in electrically heated wire heater can be considered. Although a heating temperature differs depending on the material of the second adhesive agent 12, the heating temperature is set at a temperature (for example, around 50 to 150° C.) which reduces a viscosity of the second adhesive agent 12, promoting the filling of the space 8.

Figure 9:
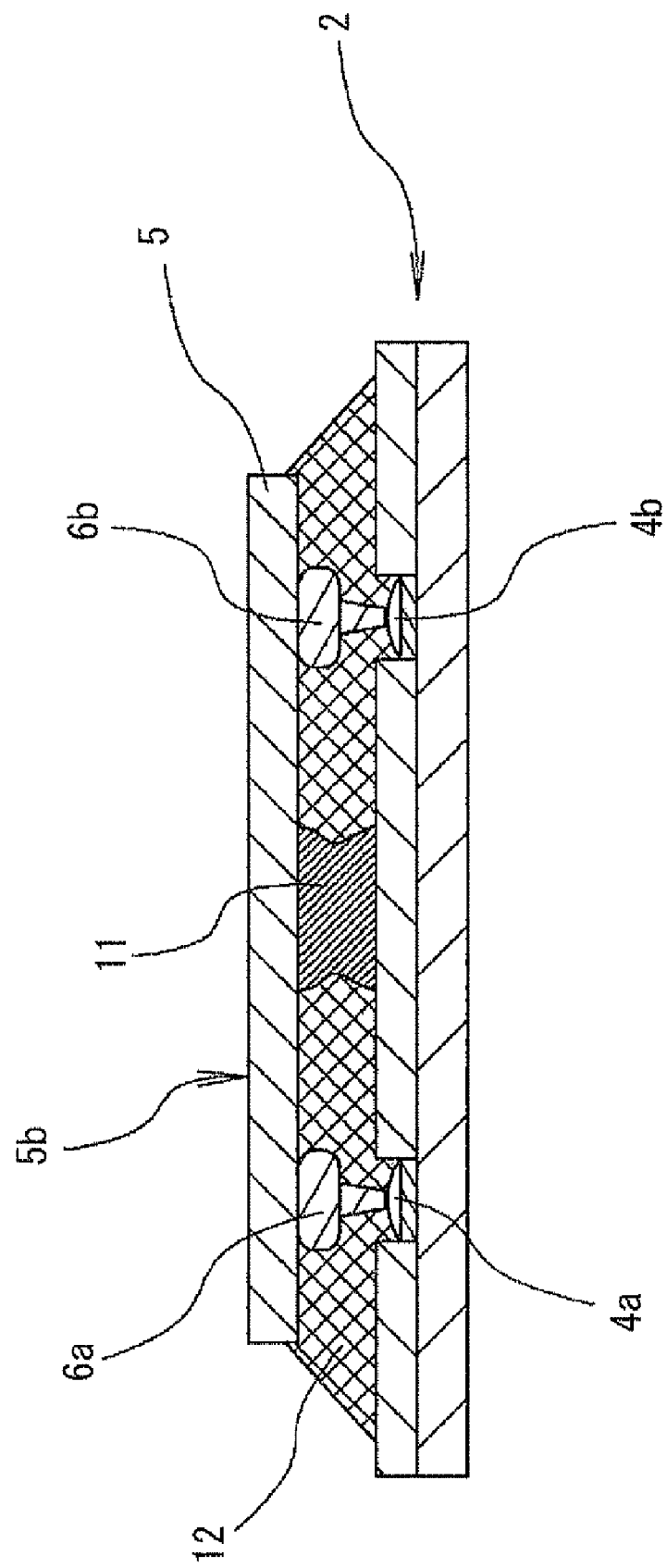
FIG. 9 is a schematic view for illustrating the example of the electronic apparatus manufacturing method according to the embodiment.

Next, as shown in FIG. 9, (S6) is performed in which the mounting substrate 2 and electronic component 5, with the space 8 filled with the second adhesive agent 12, are returned from being under reduced pressure to being under atmospheric pressure.

Because of this, an effect occurs whereby the void 9 appearing in the space 8 is caused to shrink or disappear. Specifically, for example, a volume of the void 9 appearing under a reduced pressure of 160 Torr is shrunk to 160/760, that is, approximately 20%, by returning to being under atmospheric pressure, that is, 760 Torr (approximately 101.3 kPa). Thus, it is possible to cause the void 9 to shrink or disappear to a size of a degree such that it will not be a cause of such a defect as a defective joint. The returning to atmospheric pressure is carried out by introducing room air into the receptacle 21.

Figure 10:
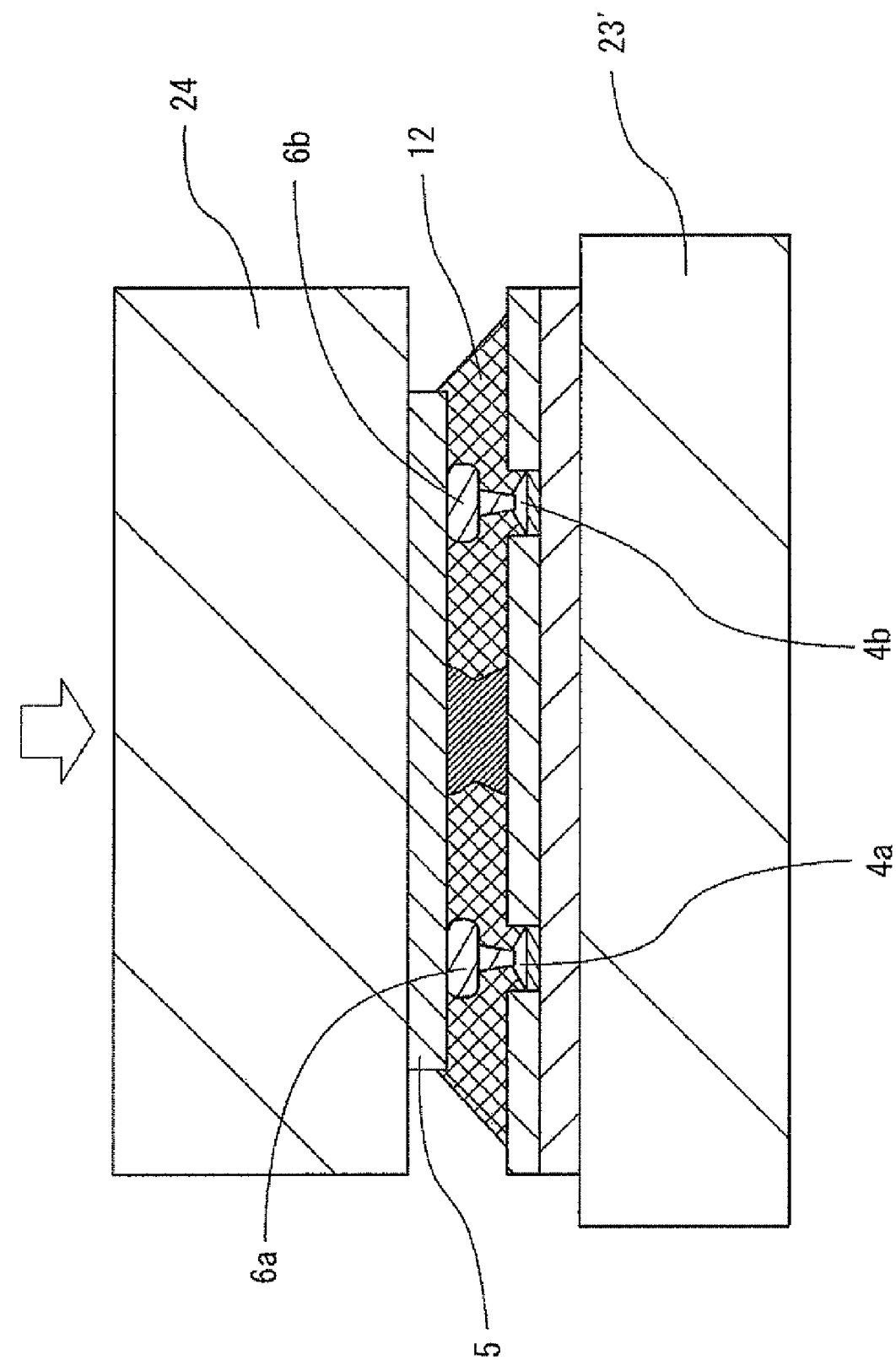
FIG. 10 is a schematic view for illustrating the example of the electronic apparatus manufacturing method according to the embodiment.
Figure 11:
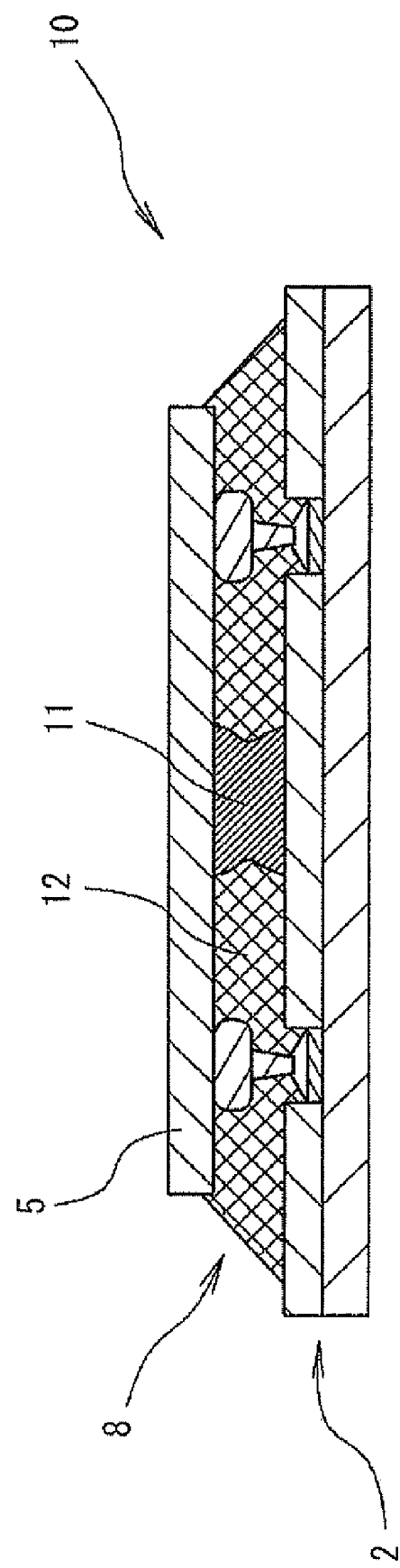
FIG. 11 is a schematic view for illustrating the example of the electronic apparatus manufacturing method according to the embodiment.

Next, as shown in FIG. 10, a second heating is performed in which the heating head 24 is pressed against the non-mounting surface 5b of the electronic component 5, and the electronic component 5 is heated by the heating head 24 (S7).

By also heating a temperature regulating stage 23' at this time, the mounting substrate 2 on which the electronic component 5 is mounted is heated to, and maintained at, a predetermined temperature. As heretofore described, although a heating temperature differs depending on the material of the second adhesive agent 12, the heating temperature of the regulating stage 23' can be set at a temperature around the same as that of the heating head 24.

By the electronic component 5 being heated, the second adhesive agent 12 of the space 8 is heated through the electronic component 5, and hardens (S8). Also, by the electronic component 5 being heated, the connection pads 4 of the mounting substrate 2 are heated through the electronic component 5, and the solder of the connection pads 4 melts. Due to the melting of the solder, the connection pads 4 and the bumps 6, which are in a contact condition, are joined (S9).

In the embodiment, a hardening temperature of the second adhesive agent 12 is set lower than a melting temperature of the solder of the connection pads 4. For this reason, by the electronic component 5 being heated, the hardening of the second adhesive agent 12 takes place first, after which the joining of the connection pads 4 and the bumps 6 due to the melting of the solder takes place. As another embodiment related to this, it is also acceptable to set the hardening temperature of the second adhesive agent 12 higher than the melting temperature of the solder of the connection pads 4. In this case, by the electronic component 5 being heated, the joining of the connection pads 4 and the bumps 6 due to the melting of the solder takes place first, after which the hardening of the second adhesive agent 12 takes place. That is, an order is S9 after S7, then S8.

By so doing, the mounting of the electronic component 5 on the mounting substrate 2 is completed, and the electronic apparatus 10 is manufactured (refer to FIG. 8).

Figure 3B:
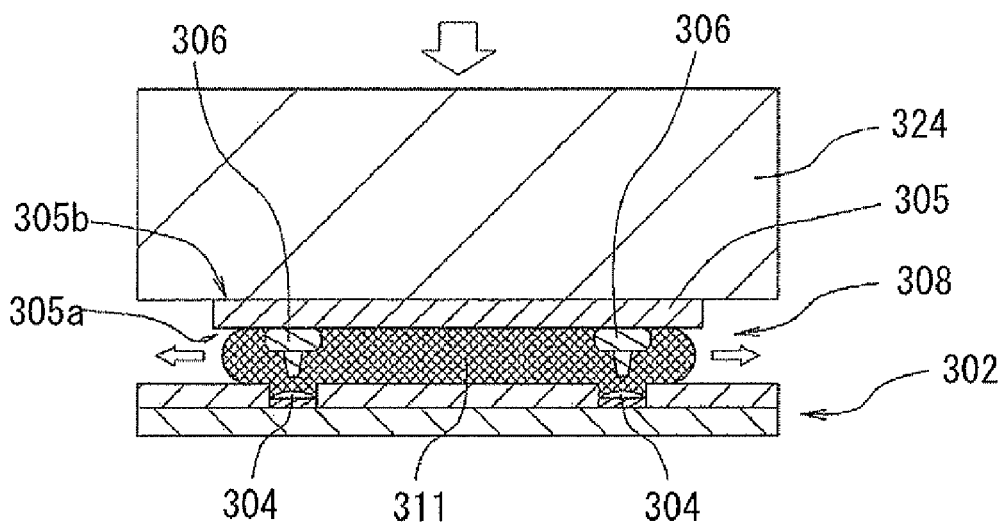
Figure 3C:
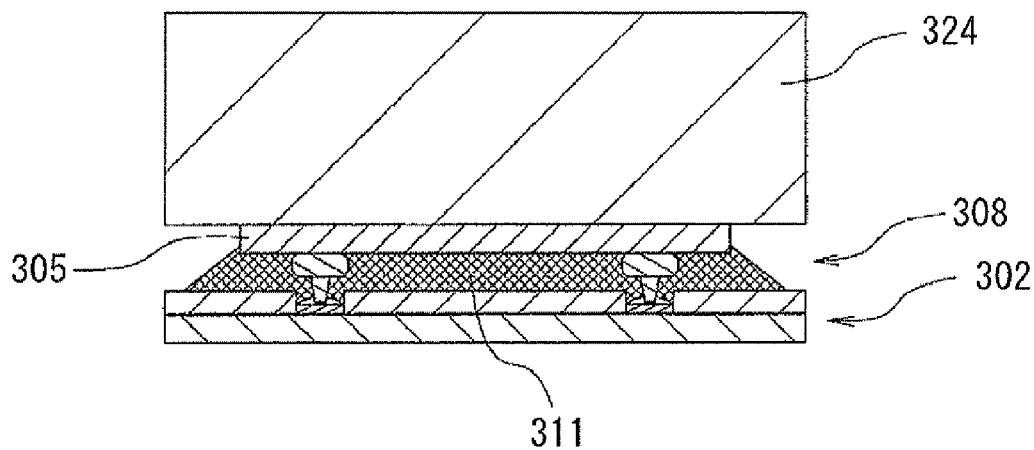

The heretofore described electronic apparatus manufacturing method according to the embodiment provides a new method differing from an "adhesive agent in last method"

illustrated by the example of FIG. 2, and an "adhesive agent in first method" illustrated by the example of FIGS. 3A-3C.

Due to the mounting substrate 2 and electronic component 5 being affixed via the first adhesive agent 11 by providing in particular S1 to S3, as a condition when the mounting substrate 2 and electronic component 5 are housed in the receptacle 21 to be depressurized in the depressurization operations, which is a post-process, a benefit is that the connection pads 4 of the mounting substrate 2 and the bumps 6 of the electronic component 5 are not joined, since the electronic component 5 is in a suspended state in relation to the mounting substrate 2, so it is possible to transport the electronic apparatus in a condition in which the mounting substrate 2 and electronic component 5 are affixed in a predetermined position, (i.e., a notable advantage is obtained in that they are fixed in a predetermined joining position without any likelihood of causing such a problem as a breakage of a joint portion during transport).

In addition, due to the mounting substrate 2 and electronic component 5 being in the condition in which they are not joined, and also in the condition in which they are affixed in the predetermined position, the height of the space 8 between the mounting substrate 2 and the electronic component 5 mounted thereon is greater than in a joined condition, and in particular, the height (gap) of the space 8 in a periphery of the peripheral portion 5c of the electronic component 5 increases, because of which an advantage arises in that it becomes easier to fill the space 8 with the second adhesive agent 12.

Also, as it is possible to fill the space 8 between the mounting substrate 2 and the electronic component 5 mounted on the mounting substrate 2 with the second adhesive agent 12 in a depressurized environment by providing in particular S4 to S6, even supposing the case in which the void 9 appears, it is possible to bring about the shrinking or disappearing thereof. As a result, even in a case of an electronic apparatus in which a wiring pitch is particularly minute, it is possible to noticeably reduce voids between wires.

In the way heretofore described, a new electronic apparatus manufacturing method is provided which can simultaneously solve a problem, namely, with the heretofore known adhesive agent in last method, a joint portion is liable to break when transporting an electronic apparatus not filled with an adhesive agent, and a problem wherein, with the heretofore known adhesive agent in the first method, an unfilled portion is liable to occur in an adhesive agent filling a space between a mounting substrate and an electronic component.

Continuing on, the procedure of the manufacturing method of the electronic apparatus according to the second embodiment will be described. FIG. 13 is the flowchart thereof. With the manufacturing method of the electronic apparatus according to the second embodiment, firstly, the same kind of S1 and S2 are performed as with the manufacturing method of the electronic apparatus according to the first embodiment.

Herein, as a characteristic configuration in the embodiment, an anaerobic resin is used as the first adhesive agent 11. Consequently, after performing S2, S3 in the first embodiment is omitted, and S4 is performed. That is, by housing the mounting substrate 2 and electronic component 5, to which a first adhesive agent 11' has been applied, in the receptacle 21, and performing (S4), in which the inside of the receptacle 21 is depressurized using the depressurizing mechanism 22, the anaerobic resin hardens, and the affixing of the mounting substrate 2 and electronic component 5 is completed.

Subsequently, the same kind of S5 to S9 are performed as with the manufacturing method of the electronic apparatus according to the first embodiment. As heretofore described, by providing in particular (S4), in which the inside of the receptacle 21 is depressurized using the depressurizing mechanism 22, a notable advantage is obtained in that it is possible to eliminate the first heating (S3) in the first embodiment, and it is also possible to harden the first adhesive agent 11. That is, while obtaining the same kind of advantage as in the first embodiment, the embodiment enables a saving of time by abbreviating the manufacturing process.

Continuing on, the procedure of the manufacturing method of the electronic apparatus according to the third embodiment will be described. FIG. 14 is the flowchart thereof. With the manufacturing method of the electronic apparatus according to the third embodiment, firstly, the same kind of S1 to S6 are performed as with the manufacturing method of the electronic apparatus according to the first embodiment.

Herein, as a characteristic configuration in the embodiment, a heating is performed in which the mounting substrate 2 and electronic component 5, filled with the second adhesive agent 12, are housed in a furnace (not shown), and heated (S7').

Subsequently, the same kind of S8 and S9 are performed as with the manufacturing method of the electronic apparatus according to the first embodiment. As heretofore described, by providing in particular the heating (S7') which uses the furnace, it being easy to realize a simultaneous heating of a plurality of the mounting substrates 2 and electronic components 5, filled with the second adhesive agent 12, a shortening of a manufacturing time is possible.

That is, in the case of the heating method using the heating head in the first embodiment, it is extremely difficult to control a pressurization and heating of a plurality of the mounting substrates 2 and electronic components 5, simultaneously, under a uniform pressure and under a uniform temperature, but the embodiment enables a solving of the problem.

As heretofore described, according to the manufacturing methods of the electronic apparatus according to the embodiments, regarding an electronic apparatus in which a space between a mounting substrate and an electronic component mounted on the mounting substrate is filled with an adhesive agent, it is possible to simultaneously solve the problem, namely, with the heretofore known adhesive agent in last method, a joint portion is liable to break when transporting an electronic apparatus not filled with the adhesive agent, and the problem wherein, with the heretofore known adhesive agent in first method, an unfilled portion is liable to occur in the adhesive agent filling a space between the mounting substrate and the electronic component. Also, because of this, it is possible to reduce an electronic apparatus rejection rate, and maintain a product quality at a high level.

Although a description has been given taking an electronic apparatus using a flip-chip connection as an example, it is, of course, also possible to apply the idea of the technology to an electronic apparatus using a wire bonding connection.

According to an aspect of an embodiment, a method of manufacturing an electronic apparatus is provided by applying a first adhesive agent to a mounting portion provided on a mounting substrate. After placing an electronic component on the mounting portion, with a mounting surface of the electronic component opposing the mounting portion in such a way that connection pads provided in the mounting portion come into contact with bumps provided on the electronic component, depending upon a type of the first adhesive agent, the electronic component is affixed to the mounting substrate by the first adhesive agent, or the electronic component is heated to affix the electronic component to the mounting substrate. A space between the mounting substrate and the electronic component affixed to the mounting substrate is filled with a second adhesive agent under reduced pressure.

The electronic component affixed to the mounting substrate and with the filled space, is returned from the reduced pressure to atmospheric pressure. The connection pads are melted to join the connection pads and the bumps to form the electronic apparatus. The connection pads are melted by a combination of heating the electronic component and/or the mounting substrate using one or more of a heater against a non-mounting surface of the electronic component, a temperature regulating stage supporting the mounting substrate, or a heating furnace.

According to an aspect of the embodiments of the invention, any combinations of the described features, functions, operations, and/or benefits can be provided. The embodiments can be implemented as an apparatus (a machine) that performs the described methods (or processes) on the described components/elements, namely on the mounting substrate, the electronic component, the adhesive agents, heaters, depressurizing receptacle, etc., to manufacture an electronic apparatus. According to an aspect of an embodiment, the apparatus controlling the methods/processes of the embodiments includes a computing apparatus (computer) including computing hardware and/or software.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. An electronic apparatus manufacturing method comprising:
    applying a first adhesive agent to a mounting portion provided on a mounting substrate;
    a first heating, after placing an electronic component on the mounting portion, with a mounting surface of the electronic component opposing the mounting potion in such a way that connection pads provided in the mounting portion come into contact with bumps provided on the electronic component, by pressing a heating head against a non-mounting surface of the electronic component, wherein the electronic component is heated, the first adhesive agent is hardened, and the mounting substrate and electronic component are affixed;
    filling a space between the mounting substrate and the electronic component affixed to the mounting substrate with a second adhesive agent under reduced pressure; and
    a second heating, after returning the mounting substrate and the electronic component, with the filled space, from the reduced pressure to atmospheric pressure, by pressing the heating head against the non-mounting surface of the electronic component, wherein the electronic component is heated, the second adhesive agent is hardened, the connection pads are melted, and the connection pads and the bumps are joined.

2. The electronic apparatus manufacturing method according to claim 1, wherein the first heating heats the electronic component at a temperature at which the first adhesive agent hardens, and at a temperature at which the connection pads do not melt.

3. The electronic apparatus manufacturing method according to claim 1 or claim 2, wherein the applying of the first adhesive agent applies the first adhesive agent preventing extending the adhesive agent to contact portions of the connection pads and the bumps, when the electronic component is placed on the mounting portion in a post-process of the applying.

4. An electronic apparatus manufacturing method comprising:
    applying a first adhesive agent made of an anaerobic resin to a mounting portion provided on a mounting substrate;
    affixing, after placing an electronic component on the mounting portion, with a mounting surface of the electronic component opposing the mounting portion in such a way that connection pads provided in the mounting portion come into contact with bumps provided on the electronic component, by making a depressurized environment, hardening the first adhesive agent, and affixing the mounting substrate and the electronic component;
    filling a space between the mounting substrate and the electronic component affixed to the mounting substrate with a second adhesive agent under reduced pressure; and
    heating, after returning the mounting substrate and electronic component, with the filled space, from the reduced pressure to atmospheric pressure, by pressing the heating head against the non-mounting surface of the electronic component, heating the electronic component, hardening the second adhesive agent, melting the connection pads, and joining the connection pads and the bumps.

5. An electronic apparatus manufacturing method comprising:
    applying a first adhesive agent to a mounting portion provided on a mounting substrate;
    a first, after placing an electronic component on the mounting portion, with a mounting surface of the electronic component opposing the mounting portion in such a way that connection pads provided in the mounting portion come into contact with bumps provided on the electronic component, by pressing a heating head against a non-mounting surface of the electronic component, heating the electronic component, hardening the first adhesive agent, and affixing the mounting substrate and electronic component;
    filling a space between the mounting substrate and the electronic component affixed to the mounting substrate with a second adhesive agent under reduced pressure; and
    a second heating, after returning the mounting substrate and electronic component, with the filled space, from the reduced pressure to atmospheric pressure, by housing the mounting substrate and the electronic component in a heating furnace, hardening the second adhesive agent, melting the connection pads, and joining the connection pads and the bumps.

6. A method of manufacturing an electronic apparatus, comprising:
    applying a first adhesive agent to a mounting provided on a mounting substrate;
    after placing an electronic component on the mounting portion, with a mounting surface of the electronic component opposing the mounting portion in such a way that a connection pad provided in the mounting portion comes into contact with a bump provided on the electronic component, depending upon a type of the first adhesive agent, affixing the electronic component to the mounting substrate by the first adhesive agent, or heating the electronic component and affixing the electronic component to the mounting substrate;

filling a space between the mounting substrate and the electronic component affixed to the mounting substrate with a second adhesive agent under reduced pressure; and returning the electronic component affixed to the mounting substrate and with the filled space, from the reduced pressure to atmospheric pressure; and melting the connection pad to join the connection pad and the bump to form the electronic apparatus.

7. The method according to claim 6, wherein the connection pad is melted by a combination of heating the electronic component and/or the mounting substrate using one or more of a heater against a non-mounting surface of the electronic component, a temperature regulating stage supporting the mounting substrate, or a heating furnace.

* * * * *